United States Patent
Kwan (10) Patent No.: US 9,477,092 B2
(45) Date of Patent: Oct. 25, 2016

(54) OPTICAL IMAGING ARRANGEMENT WITH INDIVIDUALLY ACTIVELY SUPPORTED COMPONENTS

(71) Applicant: Carl Zeiss SMT GmbH, Oberkochen (DE)

(72) Inventor: Yim-Bun Patrick Kwan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 332 days.

(21) Appl. No.: 14/138,639

(22) Filed: Dec. 23, 2013

(65) Prior Publication Data

US 2014/0176927 A1      Jun. 26, 2014

Related U.S. Application Data

(63) Continuation of application No. PCT/EP2011/061157, filed on Jul. 1, 2011.

(51) Int. Cl.
*G03B 27/54* (2006.01)
*G02B 27/64* (2006.01)
*G03F 7/20* (2006.01)

(52) U.S. Cl.
CPC ............ *G02B 27/646* (2013.01); *G03F 7/709* (2013.01); *G03F 7/7015* (2013.01); *G03F 7/70825* (2013.01); *G03F 7/70833* (2013.01)

(58) Field of Classification Search
CPC ........... G03F 7/70258; G03F 7/70775; G03F 7/70891
USPC ......................... 355/53, 67–71; 359/819–820
See application file for complete search history.

(56) References Cited

U.S. PATENT DOCUMENTS

| | | |
|---|---|---|
| 5,508,518 A | 4/1996 | Kendall |
| 5,953,105 A | 9/1999 | Van Engelen et al. |
| 6,472,840 B1 | 10/2002 | Takahashi |
| 7,283,210 B2 | 10/2007 | Hazelton |
| 7,817,248 B2 | 10/2010 | Kwan |
| 8,044,373 B2 | 10/2011 | Butler |
| 9,030,647 B2 | 5/2015 | Kwan et al. |

(Continued)

FOREIGN PATENT DOCUMENTS

| | | |
|---|---|---|
| CN | 1538243 | 10/2004 |
| CN | 1550904 | 12/2004 |

(Continued)

OTHER PUBLICATIONS

Chinese Office Action with English translation thereof for CN Appl. No. 201180073033.3, 14 pages, dated May 5, 2015.

(Continued)

*Primary Examiner* — Hung Henry Nguyen
(74) *Attorney, Agent, or Firm* — Fish & Richardson P.C.

(57) ABSTRACT

An optical imaging arrangement includes an optical projection unit and a control device. The optical projection unit includes a support structure and a group of optical element units adapted to transfer, in an exposure process using exposure light along an exposure light path, an image of a pattern of a mask unit onto a substrate of a substrate unit. The group of optical element units includes a first optical element unit and a plurality of second optical element units, the first optical element unit and the second optical element units, under a control by the control device, being actively supported by the support structure.

22 Claims, 2 Drawing Sheets

(56) References Cited

U.S. PATENT DOCUMENTS

| | | | |
|---|---|---|---|
| 2003/0197914 A1* | 10/2003 | Cox | G03F 7/70141 355/53 |
| 2004/0227107 A1 | 11/2004 | Cox et al. | |
| 2004/0257549 A1* | 12/2004 | Leenders | G03F 7/70258 355/53 |
| 2006/0215133 A1 | 9/2006 | Hazelton | |
| 2007/0076184 A1 | 4/2007 | Kwan et al. | |
| 2008/0212083 A1 | 9/2008 | Kwan | |
| 2009/0033895 A1 | 2/2009 | Binnard | |
| 2009/0180092 A1* | 7/2009 | Butler | G03F 7/709 355/67 |
| 2014/0185029 A1 | 7/2014 | Kwan et al. | |

FOREIGN PATENT DOCUMENTS

| | | |
|---|---|---|
| CN | 1839463 | 9/2006 |
| CN | 101 248 392 A | 8/2008 |
| EP | 1 321 822 | 6/2003 |
| EP | 1 477 850 | 11/2004 |
| EP | 1 646 074 | 4/2006 |
| EP | 1 886 191 A2 | 2/2008 |
| EP | 2 128 700 | 12/2009 |
| JP | 2008-543070 A | 11/2008 |
| KR | 20080019047 A | 2/2008 |
| WO | WO 2006/128713 A | 12/2006 |

OTHER PUBLICATIONS

International Search Report and Written Opinion for corresponding PCT Appl No. PCT/EP2011/061157, dated Oct. 9, 2012.
International Preliminary Report on Patentability for corresponding PCT Appl No. PCT/EP2011/061157, dated Jan. 7, 2014.
Taiwanese Office Action, with English translation thereof, for TW Patent Appl. No. 101123294, dated Mar. 23, 2015.
Japanese Office Action, with translation thereof, for JP Appn No. 2014-517472, dated May 26, 2015.
International Search Report for corresponding PCT Appl No. PCT/EP2012/053743, dated Jun. 28, 2012.
International Preliminary Report on Patentability for corresponding PCT Appl No. PCT/EP2012/053743, dated Jan. 7, 2014.

* cited by examiner

OPTICAL IMAGING ARRANGEMENT WITH INDIVIDUALLY ACTIVELY SUPPORTED COMPONENTS

CROSS-REFERENCE TO RELATED APPLICATIONS

The present application is a continuation of, and claims benefit under 35 USC 120 to, international application PCT/EP2011/061157, filed Jul. 1, 2011. The entire disclosure of international application PCT/EP2011/061157 is incorporated by reference herein.

BACKGROUND OF THE INVENTION

The invention relates to optical imaging arrangements used in exposure processes, in particular to optical imaging arrangements of microlithography systems. It further relates to a method of capturing a spatial relationship between components of an optical imaging arrangement. It also relates to method of transferring an image of a pattern onto a substrate. Furthermore, it relates to a method of supporting components of an optical projection unit. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical element units comprising optical elements, such as lenses and mirrors etc., arranged in the light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually comprise an external generally ring shaped support device supporting one or more optical element holders each, in turn, holding an optical element.

Optical element groups comprising at least mainly refractive optical elements, such as lenses, mostly have a straight common axis of symmetry of the optical elements usually referred to as the optical axis. Moreover, the optical exposure units holding such optical element groups often have an elongated substantially tubular design due to which they are typically also referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture (NA) and increased imaging accuracy of the optical system.

One approach to achieve enhanced resolution is to reduce the wavelength of the light used in the exposure process. In the recent years, approaches have been made to use light in the extreme ultraviolet (EUV) range using wavelengths ranging from 5 nm to 20 nm, typically about 13 nm. In this EUV range it is not possible to use common refractive optics any more. This is due to the fact that, in this EUV range, the materials commonly used for refractive optical elements show a degree of absorption that is too high for obtaining high quality exposure results. Thus, in the EUV range, reflective systems comprising reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

One of the crucial accuracy requirements is the accuracy of the position of the image on the substrate, which is also referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33. Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above leads to very strict requirements with respect to the relative position between the components participating in the exposure process. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the optical imaging arrangement components, i.e. the mask, the optical elements and the wafer, for example, cooperating in the exposure process must be supported in a defined manner in order to maintain a predetermined spatial relationship between the optical imaging arrangement components as well to provide a high quality exposure process.

To maintain the predetermined spatial relationship between the optical imaging arrangement components throughout the entire exposure process, even under the influence of vibrations introduced via the ground structure supporting the arrangement and/or via the atmosphere surrounding the optical imaging arrangement as well as the under the influence of thermally induced position alterations, it is necessary to at least intermittently capture the spatial relationship between certain components of the optical imaging arrangement and to adjust the position of at least one of the components of the optical imaging arrangement as a function of the result of this capturing process.

On the other hand, an increase in the numerical aperture, typically, leads to an increased size of the optical elements used, also referred to as the optical footprint of the optical elements. The increased optical footprint of the optical elements used has a negative impact on their dynamic properties and the control system used to achieve the above adjustments. Furthermore, the increased optical footprint typically leads to larger light ray incidence angles. However, at such increased larger light ray incidence angles transmissivity of the multi-layer coatings typically used for generating the reflective surface of the optical elements is drastically reduced, obviously leading to an undesired loss in light power and an increased heating of the optical elements due to absorption. As a consequence, even larger optical elements have to be used in order to enable such imaging at a commercially acceptable scale. These circumstances lead to optical imaging arrangements with comparatively large optical elements having an optical footprint of up to 1 m×1 m and which are arranged very close to each other with mutual distances ranging down to less than 60 mm.

Several problems result from this situation. First, irrespective of the so-called aspect ratio (i.e. the thickness to diameter ratio) of the optical element, a large optical element generally exhibits low resonant frequencies. While, for example, a mirror with an optical footprint of 150 mm (in diameter) and a thickness of 25 mm typically has resonant frequencies above 4000 Hz, a mirror with an optical footprint of 700 mm, typically, hardly reach resonant frequencies above 1500 Hz even at a thickness of 200 mm. Furthermore, increased size and weight of the optical elements also means increased static deformation due to variations of the gravitational constant at different locations all over the world, which impairs imaging performance when uncorrected.

With conventional support systems striving to support the optical elements at a maximum rigidity (i.e. at maximized resonant frequencies of the support system) low resonant frequencies of the optical element itself lead to a reduction of the adjustment control bandwidth and, hence, reduced position accuracy.

A further considerable problem lies within the fact that the optical elements have to be located as close to each other as possible in order to keep the object to image shift (i.e. the distance along the optical path between an object point on the mask and an image point on the substrate) small, since a large object to image shift obviously aggravates the accuracy problems due to larger structures, poorer dynamic properties and larger thermal expansion effects. These spatial boundary conditions considerably restrict the freedom of design, in particular, the freedom to place actuators and sensors for such an optical element at dynamically favorable positions. This circumstance proves to be as problematic as low resonant frequencies, if not even more. More precisely, typically, an optical element having a resonant frequency below 2000 Hz and having unfavorable sensor positions hardly reaches a control bandwidth of more than 100 Hz, while 250 Hz is typically considered necessary in commercially acceptable applications for such an optical element allowing favorable sensor placements.

Furthermore, large optical elements resulting in a large object to image shift ultimately lead to a large and less rigid support structure for the optical system. Such a less rigid support structure not only contributes to further restrictions of adjustment control performance, but also residual errors due to quasi-static deformations of the structure caused by residual low frequency vibration disturbances.

Finally, the increased thermal load on the optical elements used (due to light energy absorption) and the increased throughput desired for such systems requires increased cooling efforts, in particular, higher flow rates of the cooling fluids used. This increased cooling flow rate is prone to lead to an increase in the vibration disturbances introduced into the system, in turn leading to reduced line-of-sight accuracy.

SUMMARY OF THE INVENTION

It is thus an object of the invention to, at least to some extent, overcome the above disadvantages and to provide good and long term reliable imaging properties of an optical imaging arrangement used in an exposure process.

It is a further object of the invention to reduce the effort necessary for an optical imaging arrangement while at least maintaining the imaging accuracy of the optical imaging arrangement used in an exposure process.

These objects are achieved according to the invention which, according to one aspect, is based on the technical teaching that an overall reduction of the effort necessary for an optical imaging arrangement while at least maintaining the imaging accuracy of the optical imaging arrangement may be achieved if a conventional support strategy striving to achieve individual support of the optical element units to be as rigid as possible (to achieve stable and accurate global positioning of the individual optical element unit) is dispensed with in favor of a modified concept according to which a first one of the optical element units, typically the largest and heaviest one posing the most severe problems in reaching the required high control bandwidth, is actively supported in a controlled manner at a low bandwidth (at which control may be readily achieved for this optical element unit) while at least the other, second optical element units of the optical system follow the movements of the first optical element unit to maintain a sufficiently stable and accurate spatial relation of at least all the optical element units of the optical system with respect to the first optical element unit and, hence, with respect to each other.

It will be appreciated that, preferably, some or all further components participating in the exposure process, in particular the mask unit and the substrate unit, in a similar manner also follow the movements of the first optical element unit to maintain a sufficiently stable and accurate spatial relation of these components with respect to the first optical element unit.

It is to be noted that active support, in the sense of the present invention, designates a support concept where the respective optical element unit is supported via active components or units actively adjusting (e.g. under the control of a corresponding control unit) a position and/or an orientation of the optical element unit in at least one degree of freedom at a predetermined control bandwidth.

It is to be further noted that the active low control bandwidth support of the critical first optical element unit has the advantage that, compared to a further concept with a vibration isolated support of the first optical element unit (e.g. having a resonant frequency below 1 Hz), the low bandwidth control of the first optical element unit allows the first optical element unit to follow motions of a metrology structure of a metrology system capturing a spatial relationship between the first optical element unit and the metrology structure. By this approach excessive relative motion between the first optical element unit and the metrology structure going beyond the capturing range of the capturing devices of the metrology system or, in other words, sensor range problems may be avoided in a very beneficial way.

As a consequence, despite the fact that, typically, all components participating in the exposure process now have to be actively controlled, the requirements for the control bandwidth of the most critical first optical element unit are greatly relaxed in a highly beneficial way. This positive effect, generally, largely outweighs the increased expense for the active support. In particular, appropriate adjustment control of an optical system including such a large optical footprint first optical element unit is greatly facilitated (if not even rendered commercially feasible at all).

Hence, for example, compared to conventional systems where, typically, an adjustment control bandwidth of 200 Hz to 300 Hz is used and considered necessary for each individual optical element unit, with the present invention a considerably lower adjustment control bandwidth, e.g. between 5 Hz to 100 Hz, preferably between 40 Hz to 100 Hz, may be used for the critical first optical element unit, while other components participating in the imaging process (such as, for example, further optical element units, mask units and substrate units) may be controlled at the conventionally desired higher adjustment control bandwidth of, for example, 200 Hz to 300 Hz.

Hence, it is possible to use the critical (typically large and/or heavy) first optical element unit as an inertial reference to which one or more of the other components (up to all of the other components) may be referred to for measuring and, ultimately, adjustment purposes.

It will be appreciated that, in the sense of the present invention, an optical element unit may merely consist of an optical element, such as a mirror. However, such an optical element unit may also comprise further components such as a holder holding such an optical element.

Thus, according to a first aspect of the invention there is provided an optical imaging arrangement comprising an optical projection unit and a control device. The optical projection unit comprises a support structure and a group of optical element units adapted to transfer, in an exposure process using exposure light along an exposure light path, an image of a pattern of a mask unit onto a substrate of a substrate unit. The group of optical element units comprises a first optical element unit and a plurality of second optical element units, the first optical element unit and the second optical element units, under a control by the control device, being actively supported by the support structure. The first optical element unit is actively supported at a low first control bandwidth, while the second optical element units are actively supported at a second control bandwidth to substantially maintain a given spatial relationship of each of the second optical elements with respect to the first optical element unit.

According to a second aspect of the invention there is provided a method of supporting components of an optical projection unit. The method comprises providing a support structure, providing a group of optical element units comprising a first optical element unit and a plurality of second optical element units, individually actively supporting each one of the optical element units via the support structure such that the group of optical element units forms an optical system transferring, in an exposure process, an image of a pattern of a mask unit onto a substrate of a substrate unit. The first optical element unit is actively supported at a low first control bandwidth, while the second optical element units are actively supported at a second control bandwidth to substantially maintain a given spatial relationship of each of the second optical elements with respect to the first optical element unit.

According to a third aspect of the invention there is provided an optical imaging arrangement comprising an optical projection unit. The optical projection unit comprises a support structure and a group of optical element units adapted to transfer, in an exposure process using exposure light along an exposure light path, an image of a pattern of a mask unit onto a substrate of a substrate unit. The group of optical element units comprises a first optical element unit and a plurality of second optical element units. The first optical element unit; the second optical element units; the mask unit and the substrate unit, under a control by the control device, being actively supported by a support structure, the first optical element unit being actively supported at a low first control bandwidth, the second optical element units being actively supported at a second control bandwidth to substantially maintain a given spatial relationship of each of the second optical elements with respect to the first optical element unit, the mask unit being actively supported at a third control bandwidth to substantially maintain a given spatial relationship of the mask unit with respect to the first optical element unit and the substrate unit being actively supported at a third control bandwidth to substantially maintain a given spatial relationship of the substrate unit with respect to the first optical element unit.

The above objects are also achieved according to a further aspect of the invention, which is based on the technical teaching that an overall reduction of the effort necessary for an optical imaging arrangement while at least maintaining the imaging accuracy of the optical imaging arrangement may be achieved by a dynamically and metrologically favorable design of certain optical element units of the optical imaging arrangement.

More precisely, it has been found that the design of optical element units located under unfavorable spatial boundary conditions for the placement of components of the metrology arrangement (capturing the spatial relationship between the optical element unit and a given reference) may be modified to shift the location of metrologically interesting points of the optical element unit, such as nodal points experiencing minimum (typically zero) excursion at certain vibrational modes of the optical element unit, towards locations available (according to the given spatial boundary conditions) for placement of components of the metrology arrangement.

Shifting the location of such nodal points towards locations available for placement of metrology components has the great advantage that vibration induced deformation of the optical element unit at these particular vibrational modes does not or at least less adversely influence the result of capturing processes performed by the metrology arrangement and intended to obtain the so-called rigid body motions of the optical element unit. Such an elimination of vibration modal deformation influences on the capturing result greatly improves stability of the adjustment control process.

For example, in a conventional approach, it may be the case that the necessary spatial arrangement of the optical elements requires comparatively long and narrow optical elements where the spatial boundary conditions (such as placement of further optical element in close proximity) only allow placement of the metrology components at the short longitudinal ends of the optical element unit. Since the first vibrational mode (at the first resonant frequency) of such a long and narrow optical element is bending (with the nodal points of this first vibrational mode being located at a considerable distance from the outer circumference of a conventionally designed optical element unit), the metrology components located at the short longitudinal ends move in anti-phase to the central part of the optical element comprising the optical surface which ultimately has to be adjusted according to given specifications. Such an out-of-phase measurement typically leads to instability of the metrology loop. As outlined above, shift of the respective nodal point achieved according to the present invention at least greatly alleviate these problems.

According to this aspect of the invention, a geometry and/or a mass distribution and/or a rigidity distribution of the respective optical element unit is selected such that a nodal point of the optical element unit is shifted towards a location available for placement of a reference element of the metrology arrangement used to determine the spatial relationship between the optical element unit and a reference unit. Typically, according to this aspect of the invention, this is achieved by deliberately structurally weakening the optical element unit to achieve an outward shift of such nodal points towards the outer circumference where, typically, sufficient space for placement of metrology components is more readily available.

Corresponding local structural weakening of the optical element unit may be achieved in several ways. For example, mass may be added and/or removed from the optical elements unit at specific locations in the region of its outer circumference, e.g. by simply modifying the overall geometry of the optical element unit introducing corresponding recesses into the optical element unit. A modification of the mass may also be achieved by a corresponding density distribution of the material(s) used for the optical element unit. Furthermore, in addition or as an alternative, the distribution of the structural rigidity of the optical element unit may be modified. For example, structural rigidity of the optical element unit may be given an appropriate distribution over the optical element units such that the desired shift of the respective nodal point is achieved.

Such a modification of the structural rigidity distribution may be achieved, for example, by introducing compliance providing features such as one or more recesses (such as appropriate grooves, bores or the like) or cavities into the optical element unit, e.g. in the region of the outer circumference of the optical element unit. These compliance providing features provide, to a certain extent, dynamic decoupling of the part of the mass located radially outward of these compliance providing features thereby achieving the desired outward shift of the nodal points.

It will be appreciated that such weakening of the optical element unit typically reduces the resonant frequency of the optical element unit which, conventionally, is considered as being unfavorable in terms of adjustment control performance (i.e. control performance in the adjustment of the position and/or orientation of the optical element unit). However, it has been found that the increased control loop stability achieved according to the present invention (as a result of the more favorable phase information of the sensed position and/or orientation of the optical element unit) greatly outweighs this sacrifice in resonant frequency such that adjustment control performance is improved significantly.

It will be appreciated that the concept according to the invention may be applied to any desired degree of freedom to be captured. Preferably, it is applied to the so-called optically sensitive degrees of freedom, i.e. those degrees of freedom in which adjustment accuracy of the optical element unit has the greatest effect on imaging accuracy (in particular the line-of-sight accuracy) of the overall system. Typically, in a conventional generally vertical arrangement of the optical column, these optically sensitive degrees of freedom are the translatory degree of freedom along a vertical axis and the two rotatory degrees of freedom about the two axes perpendicular to this vertical axis.

Hence, according to a fourth aspect of the invention there is provided an optical imaging arrangement comprising: an optical projection unit and a metrology arrangement. The optical projection unit comprises a support structure and a group of optical element units adapted to transfer, in an exposure process using exposure light along an exposure light path, an image of a pattern onto a substrate, wherein the group of optical element units comprises a plurality of optical element units. The metrology arrangement captures, in at least one degree of freedom, a spatial relationship between a reference unit and an associated optical element unit of the group of optical element units. The metrology arrangement comprises a reference element, the reference element being mechanically connected directly to the associated optical element unit at a reference element location selection of the reference element location being limited by spatial boundary conditions of the associated optical element unit. The associated optical element unit has a deformation vibration mode at a resonant frequency, wherein the optical element unit, in the vibration mode, exhibits deformation induced motion in the at least one degree of freedom and has at least one nodal point exhibiting minimum motion in the least one degree of freedom. At least one of a geometry, a mass distribution and a rigidity distribution of the optical element unit is selected as a function of the reference element location such that the reference element location is located at least close to the nodal point.

According to a fifth aspect of the invention there is provided a method of capturing a spatial relationship between an optical element unit and a reference unit of an optical imaging arrangement. The method comprises providing a group of optical element units adapted to transfer, in an exposure process, an image of a pattern onto a substrate and comprising at least one optical element unit having a deformation vibration mode at a resonant frequency, the optical element unit, in the vibration mode, exhibiting deformation induced motion in at least one degree of freedom and having at least one nodal point exhibiting minimum motion in the at least one degree of freedom. It further comprises providing a metrology arrangement comprising a reference element and mechanically directly connecting the reference element to the at least one optical element unit at a reference element location, selection of the reference element location being limited by spatial boundary conditions of the associated optical element unit. It further comprises capturing via the metrology arrangement, in the at least one degree of freedom, a spatial relationship between a reference unit and the at least one optical element unit. The providing the group of optical element units further comprises selecting at least one of a geometry, a mass distribution and a rigidity distribution of the at least one optical element unit as a function of the reference element location such that the reference element location is located at least close to the nodal point.

According to a sixth aspect of the invention there is provided a method of transferring an image of a pattern onto a substrate. The method comprises, in a transferring step, transferring the image of the pattern onto the substrate using an optical imaging arrangement, in a capturing step of the transferring step, capturing a spatial relationship between an optical element unit and a reference unit of an optical imaging arrangement using the method of capturing such a spatial relationship according to the invention, and, in a controlling step of the transferring step, controlling at least one of a position and an orientation of at least one component of the optical imaging arrangement as a function of the spatial relationship captured in the capturing step.

Further aspects and embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

In the following, a preferred first embodiment of an optical imaging arrangement 101 according to the invention with which preferred embodiments of methods according to the invention may be executed will be described with reference to FIGS. 1 to 5. To facilitate understanding of the following explanations a xyz coordinate system is introduced in the Figures, wherein the z-direction designates the vertical direction (i.e. the direction of gravity).

Figure 1:
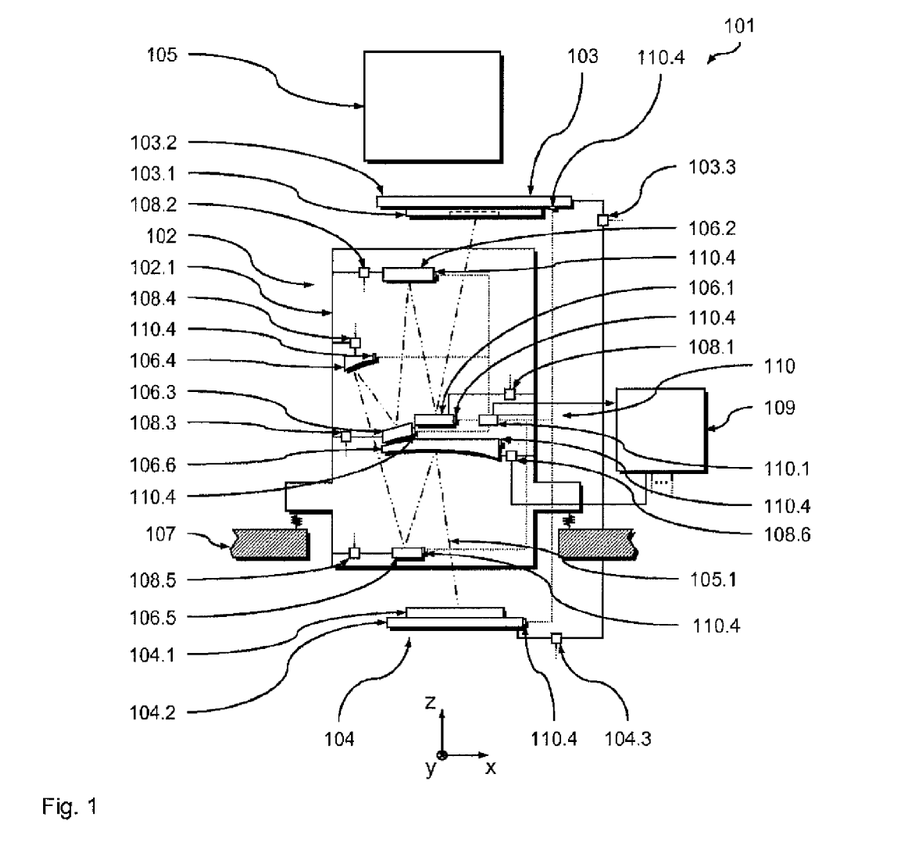
FIG. 1 is a schematic representation of a preferred embodiment of an optical imaging arrangement according to the invention with which preferred embodiments of methods according to the invention may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 comprises an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 comprises an illumination system 105 illuminating the reflective mask 103.1 via an appropriate light guide system (not shown). The optical projection unit 102 receives the light (represented by its chief ray 105.1) reflected from the mask 103.1 and projects the image of the pattern formed on the mask 103.1 onto the substrate 104.1, e.g. a wafer or the like.

To this end, the optical projection unit 102 holds an optical element unit group 106 of optical element units 106.1 to 106.6. This optical element unit group 106 is held within a support structure 102.1. The support structure 102.1 may take the form of a housing of the optical projection unit 102, which, in the following, is also referred to as the projection optics box (POB) 102.1. It will be appreciated, however, that this support structure does not necessarily have to form a complete or tight enclosure of the optical element unit group 106. Rather it may also be partially formed as an open structure.

The projection optics box 102.1 is supported in a vibration isolated manner on a base structure 107 which also supports the mask table 103.2 via a mask table support device 103.3 and the substrate table 104.2 via a substrate table support device 104.3. It will be appreciated that the projection optics box 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range.

The optical element unit group 106 comprises a total of six optical element units, namely a first optical element unit 106.1, a second optical element unit 106.2, a third optical element unit 106.3, a fourth optical element unit 106.4, a fifth optical element unit 106.5 and sixth optical element unit 106.6. In the present invention, each of the optical element units 106.1 to 106.6 consists of an optical element in the form of a mirror.

It will be appreciated however that, with other embodiments of the invention, the respective optical element unit may also comprise further components (beyond the optical element itself) such as, for example, aperture stops, holders or retainers holding the optical element and eventually forming an interface for the support unit connecting the optical element unit to the support structure.

It will be further appreciated that, with other embodiments of the invention, an other number of optical element units may be used. Preferably, four to eight optical element units are provided.

Each one of the mirrors 106.1 to 106.6 is supported on the support structure formed by the projection optics box 102.1 by an associated support device 108.1 to 108.6. Each one of the support devices 108.1 to 108.6 is formed as an active device such that each of the mirrors 106.1 to 106.6 is actively supported at a defined control bandwidth.

In the present example, the optical element unit 106.6 is a large and heavy component forming a first optical element unit of the optical element unit group 106 while the other optical element units 106.1 to 106.5 form a plurality of second optical element units of the optical element unit group 106. The first optical element unit 106.6 is actively supported at a low first control bandwidth, while the second optical element units 106.1 to 106.5 are actively supported at a second control bandwidth to substantially maintain a given spatial relationship of each of the second optical element units 106.1 to 106.5 with respect to the first optical element unit 106.6 as will be explained further below.

In the present example, a similar active support concept is chosen for the mask table support device 103.3 and the substrate table support device 104.3 both also actively supported at a third and fourth control bandwidth, respectively, to substantially maintain a given spatial relationship of the mask table 103.2 and the substrate table 104.2, respectively, with respect to the first optical element unit 106.6. It will be appreciated however that, with other embodiments of the invention, another support concept may be chosen for the mask table and/or the substrate table.

As will be explained in further detail below, control of the active support devices 108.1 to 108.6, 103.3 and 104.3 is performed by a control unit 109 as a function on the signals of a metrology arrangement 110. Adjustment control of the components participating in the imaging process is performed the following way.

To achieve the active low bandwidth support the first optical element unit 106.6, the first support device 108.6 of the first optical element unit 106.6 is configured and controlled to provide adjustment of the first optical element unit 106.6 with respect to a component of the metrology arrangement 110 at a first adjustment control bandwidth ranging from 5 Hz to 100 Hz, preferably from 40 Hz to 100 Hz.

Furthermore, to achieve the active support the second optical element units 106.1 to 106.5, the mask table 103.2 and the substrate table 104.2, respectively, each of the second support devices 108.1 to 108.5 of the second optical element units 106.1 to 106.5 as well as the mask table support device 103.3 and the substrate table support device 104.3, respectively, is configured and controlled to provide adjustment of the respective associated optical element unit 106.1 to 106.5, the mask table 103.2 and the substrate table 104.2, respectively, at a second, third and fourth adjustment control bandwidth, respectively, ranging from 5 Hz to 400

Hz, preferably from 200 Hz to 300 Hz. It will be appreciated that, with certain embodiments of the invention, the second control bandwidth may vary among the second support devices 108.1 to 108.5.

As outlined above, the present invention, compared to conventional designs, follows a modified support strategy according to which the large and heavy first optical element unit 106.6 posing the most severe problems in reaching the high control bandwidth typically required in EUV microlithography is actively supported in a controlled manner at a low bandwidth (at which control may be readily achieved for this optical element unit 106.6) while the other components participating in the exposure process, i.e. the second optical element units 106.1 to 106.5, the mask table 103.2 and the substrate table 104.2, are controlled to maintain a sufficiently stable and accurate spatial relation with respect to the first optical element unit 106.6 and, hence, with respect to each other.

Hence, despite the fact that, in the present example, all components participating in the imaging process (i.e. the mirrors 106.1 to 106.6, the mask 103.1 and the substrate 104.1) are actively controlled, the greatly relaxed requirements for the adjustment control bandwidth of the first optical element unit 106.6 largely outweigh the increased expense for the active support of the individual components. In particular, adjustment control of a large optical footprint component such as the sixth mirror 106.6 (which may have an optical footprint of up to 1.5 m×1.5 m and a mass of up to 350 kg) is greatly facilitated compared to conventional systems where, typically, an adjustment control bandwidth of 200 Hz to 300 Hz is used and considered necessary (a control bandwidth that can hardly be reached for such large optical footprint components due to their low resonant frequency).

According to the support strategy of the present invention one component of the optical system (typically a large and/or heavy one of these components) is used as an inertial reference to which one or more of the other components (up to all of the other components) may be referred to for measuring and, ultimately, adjustment purposes. In the present example, the large optical footprint sixth mirror 106.6 is used as the inertial reference to which all further components 106.1 to 106.5, 103.1 and 104.1 participating in the imaging process are referred to as will be explained in further detail below. It will be appreciated however that, with other embodiments of the invention, depending on the optical design, any suitable component other than the optical element unit hit last by the exposure light may be used as this inertial reference.

Figure 2:
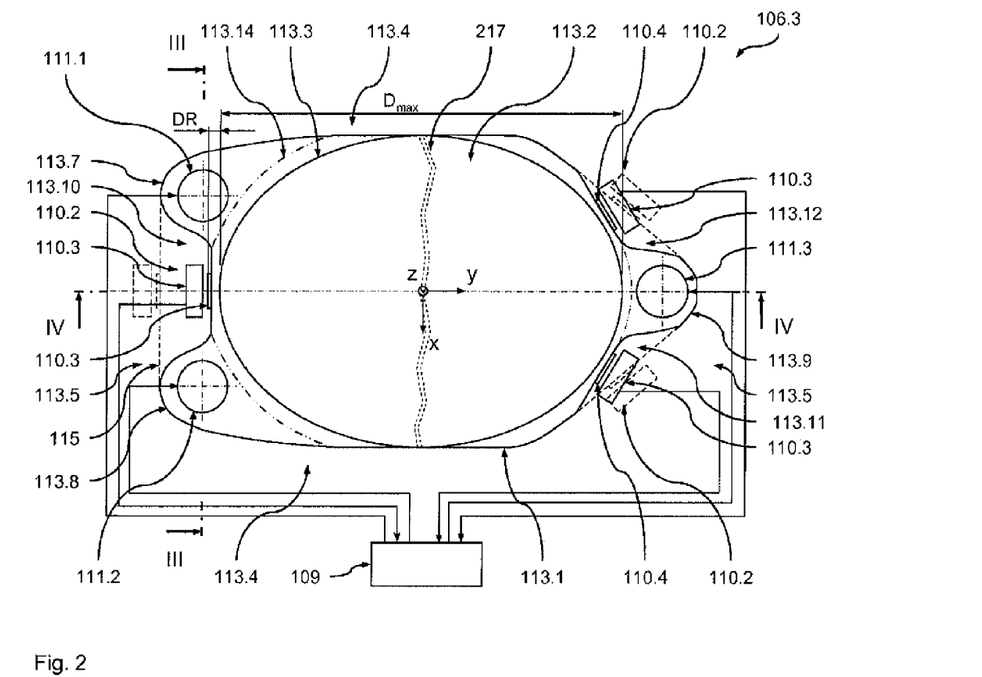
FIG. 2 is a schematic top view of an optical element unit of the optical imaging arrangement of FIG. 1.
Figure 3:
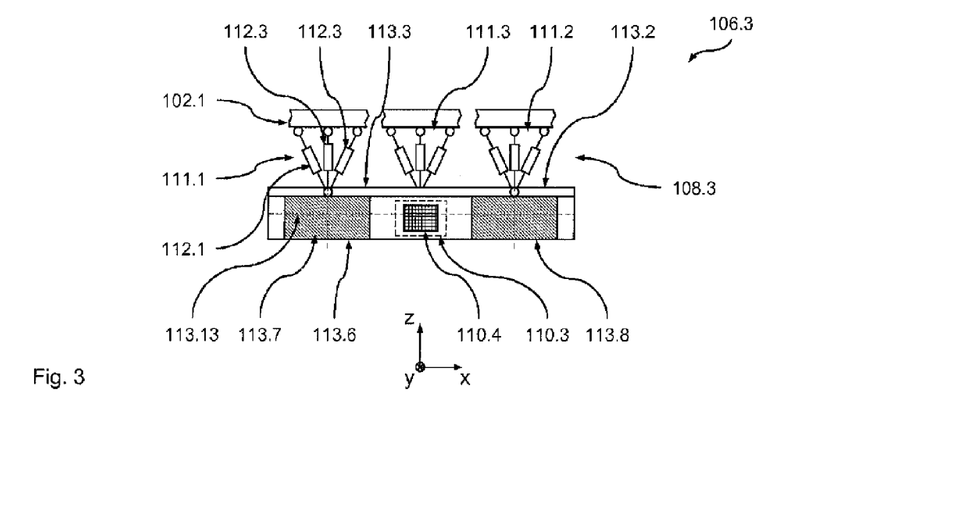
FIG. 3 is a schematic sectional representation of the optical element unit of FIG. 2 along line III-III of FIG. 2.

The specific design of the mirror support devices 108.1 to 108.6 will be explained in the following using the example of the mirror and support device 108.3 of the third optical element unit 106.3 which is shown in FIGS. 2 and 3. In the present example, all mirror support devices 108.1 to 108.6 basically have the same components and the same functionality. It will be appreciated however that, with other embodiments of the invention, a different design may be chosen among the individual mirror support devices used.

As can be seen from FIGS. 2 and 3, the mirror support device 108.3 exclusively comprises three support units 111.1 to 111.3 distributed at the outer circumference of the mirror 106.3. Each support unit 111.1 to 111.3 exclusively comprises two actuator devices 112.1 and 112.2 arranged in the manner of a bipod as well as a centrally arranged active gravity compensation device 112.3.

It will be appreciated however that, with other embodiments of the invention, any other suitable design and alignment of the components of the mirror support devices may be chosen. For example, one of the actuator devices may be combined with the active gravity compensation device and act in the direction of gravity. The remaining actuator device then may have a line of action which is inclined (e.g. at an angle of around 60°) but not perpendicular with respect to the line of action of the other actuator device.

The actuator devices 112.1 and 112.2 as well as the gravity compensation device 112.3 at one end are connected to the outer circumference of the mirror 106.3. At their other end of the actuator devices 112.1 and 112.2 as well as the gravity compensation device 112.3 are connected to a structural component of the projection optics box 102.1. Hence, the actuator devices 112.1 and 112.2 of all three support units 111.1 to 111.3 form a hexapod support serving to adjust the position and orientation of the mirror 106.3 in all six degrees of freedom.

It will be appreciated however that, with other embodiments of the invention, adjustment of the respective optical element unit in space may be provided in any other desired number of degrees of freedom depending on the requirements for the respective optical element unit. More precisely, depending on the spatial and optical boundary conditions, motion of the optical element unit in one or more degrees of freedom may be optically irrelevant (i.e. may have no noticeable effect on imaging accuracy) such that adjustment in the respective degree of freedom may be dispensed with (such as it may be the case, for example, for a translatory motion of a planar optical surface within its plane). Furthermore, any other desired number and/or arrangement of actuators may be used to achieve the desired adjustment in the desired number of degrees of freedom.

The three gravity compensation devices 112.3 each counteract a fraction of the gravitational force acting on the mirror 106.3 such that, together, they serve to cumulatively compensate the gravitational force acting on the mirror 106.3. Hence, that the actuator devices 112.1 and 112.2 only have to generate the dynamic forces necessary for adjusting the mirror 106.3 (i.e. its position and/or orientation) in space. It will be appreciated however that, with other embodiments of the invention, such a gravity compensation device may also be omitted.

Each actuator device 112.1 and 112.2 as well as the gravity compensation device 112.3 comprises a so-called force actuator (i.e. an actuator generating a predefined actuating force in response to a given control signal) in the form of a so-called Lorentz actuator (often also referred to as voice coil motors). This solution has the advantage that the Lorentz actuators are non-contact actuators allowing dynamic decoupling of the mirror and the supporting structure. In particular, the rigidity of the respective Lorentz actuator may be tuned to match the desired resonant frequency of the mirror support device 108.3.

It will be appreciated however, that with other embodiments of the invention, a different concept may be used for the actuator devices as long as the desired control bandwidth of the support is achieved. For example, a combination of a so-called displacement actuator (i.e. an actuator generating a predefined actuating displacement in response to a given control signal) may also be used (either alone or in combination with a force actuator). Similar applies for the gravity compensation devices. Here, for example, even a passive concept may be used.

The image of the pattern formed on the mask 103.1 is usually reduced in size and transferred to several target areas of the substrate 104.1. The image of the pattern formed on the mask 103.1 may be transferred to the respective target area on the substrate 104.1 in two different ways depending on the design of the optical exposure apparatus 101. If the optical exposure apparatus 101 is designed as a so called wafer stepper apparatus, the entire image of the pattern is transferred to the respective target area on the substrate 104.1 in one single step by irradiating the entire pattern formed on the mask 103.1. If the optical exposure apparatus 101 is designed as a so called step-and-scan apparatus, the image of the pattern is transferred to the respective target area on the substrate 104.1 by progressively scanning the mask table 103.2 and thus the pattern formed on the mask 103.1 under the projection beam while performing a corresponding scanning movement of the substrate table 104.2 and, thus, of the substrate 104.1 at the same time.

In both cases, a given spatial relationship between the components participating in the exposure process (i.e. between the optical elements of the optical element unit group 106, i.e. the mirrors 106.1 to 106.6, with respect to each other as well as with respect to the mask 103.1 and with respect to the substrate 104.1 has to be maintained within predetermined limits to obtain a high quality imaging result.

During operation of the optical exposure apparatus 101, the relative position of the mirrors 106.1 to 106.6 with respect to each other as well as with respect to the mask 103.1 and the substrate 104.1 is subject to alterations resulting from, both, intrinsic and extrinsic, disturbances introduced into the system. Such disturbances may be mechanical disturbances, e.g. in the form vibrations resulting from forces generated within the system itself but also introduced via the surroundings of the system, e.g. the base structure 107 (which itself may formed by a ground structure or be supported on a ground structure). They may also thermally induced disturbances, e.g. position alterations due to thermal expansion of the parts of the system.

In order to keep the above predetermined limits of the spatial relation of the mirrors 106.1 to 106.6 with respect to each other as well as with respect to the mask 103.1 and the substrate 104.1, each one of the mirrors 106.1 to 106.6 is actively positioned in space via their support devices 108.1 to 108.6, respectively. Similarly, the mask table 103.2 and the substrate table 104.2 are actively positioned in space via the respective support devices 103.3 and 104.3, respectively.

In the following, the control concept from the spatial adjustment of the components 106.1 to 106.6, 103.1 and 104.1 participating in the imaging process will be described with reference to FIGS. 1 to 3. As mentioned above, control of the adjustment of the components 106.1 to 106.6, 103.1 and 104.1 in all six degrees of freedom is done using the control unit 109 connected and providing corresponding control signals to each one of the support devices 108.1 to 108.6, 103.3 and 104.3 (as it is indicated in FIG. 1 by the solid and dotted lines at the control unit 109 and the respective support device) at the specific adjustment control bandwidth as outlined above.

The control unit 109 generates its control signals as a function on the metrology signals of the metrology arrangement 110 which captures the position and orientation of each one of the components 106.1 to 106.6, 103.1 and 104.1 in all six degrees of freedom (as it is indicated by the dotted lines in FIG. 1). As mentioned above, the metrology arrangement 110 uses the large optical footprint sixth mirror 106.6 as an inertial reference (i.e. as a reference optical element unit) to which all further components 106.1 to 106.5, 103.1 and 104.1 participating in the imaging process are referred to. As can be seen from FIG. 1, the sixth mirror 106.6, in the light path, is the ultimate mirror unit hit last by the exposure light 105.1 when transferring the image of a pattern formed on the mask 103.1 onto the substrate 104.1.

To this end, the metrology arrangement uses a metrology unit 110.1 comprising a plurality of metrology devices 110.2 mechanically connected to a metrology structure which in turn is supported by the projection optics box structure 102.1 as it is (highly schematically) indicated in FIG. 1. As can be seen from FIG. 3, in the present embodiment, each metrology device 110.2 comprises a sensor head 110.3 connected to the metrology structure and cooperating with the reference element 110.4 mechanically connected directly to the mirror 106.3.

The term "mechanically connected directly", in the sense of the invention, is to be understood as a direct connection between two parts including (if any) a short distance between the parts allowing to reliably determine the position of the one part by measuring the position of the other part. In particular, the term may mean without the interposition of further parts introducing uncertainties in the position determination, e.g. due to thermal or vibration effects. It will be appreciated that, with certain embodiments of the invention, the reference element may not be a separate component connected to the mirror but many be directly or integrally formed on a surface of the mirror, e.g. as a grating or the like formed in a separate process upon manufacture of the mirror.

In the present embodiment, the metrology devices 110.2 operate according to an encoder principle, i.e. the sensor head 110.3 emits a sensor light beam towards a structured surface and detects a reading light beam reflected from the structured surface of the reference element 110.4. The structured surface may be, for example, a grating comprising a series of parallel lines (one-dimensional grating) or a grid of mutually inclined lines (two-dimensional grating) etc. Positional alteration is basically captured from counting the lines passed by the sensor beam which may be derived from the signal achieved via the reading beam.

It will be appreciated however that, with other embodiments of the invention, apart from the encoder principle any other type of contactless measurement principle (such as e.g. an interferometric measurement principle, a capacitive measurement principle, an inductive measurement principle etc) may be used alone or in arbitrary combination. However, it will also be appreciated that, with other embodiments of the invention, any suitable contact based metrology arrangement may be used as well. As contact based working principles magnetostrictive or electrostrictive working principles etc may be used for example. In particular, the choice of the working principle may be made as a function of the accuracy requirements.

The metrology device 110.2 associated to the sixth mirror 106.6 (in all six degrees of freedom) captures the first spatial relationship between the metrology structure and the sixth mirror 106.6 which forms the inertial reference. Furthermore, the metrology devices 110.2 associated to the other components 106.1 to 106.5, 103.1 and 104.1 participating in the imaging process (in all six degrees of freedom) capture the spatial relationship between the metrology structure and the associated component 106.1 to 106.5, 103.1 and 104.1. Finally, the metrology arrangement 110 determines the spatial relationship between the sixth mirror 106.6 and the respective further component 106.1 to 106.5, 103.1 and 104.1 using the first spatial relationship and the second spatial relationship. Corresponding metrology signals are then provided to the control unit 109 which in turn generates, as a function of these metrology signals, corresponding control signals for the respective support device 108.1 to 108.6, 103.3 and 104.3.

In the embodiment shown, as a function of the metrology signals representative of the first spatial relationship between the metrology structure and the sixth mirror 106.6, the control unit 109 generates corresponding control signals for the first support device 108.6 of the sixth mirror 106.6 (i.e. the first optical element unit in the sense of the present invention) to adjust the sixth mirror 106.6 at the above first adjustment control bandwidth (ranging from 5 Hz to 100 Hz, preferably from 40 Hz to 100 Hz) with respect to the metrology structure of the metrology unit 110.1.

This low bandwidth control of the critical first optical element unit 106.6 provides low bandwidth drift control of the first optical element unit 106.6 with respect to the metrology structure of the metrology unit 110.1. In other words, it allows the first optical element unit 106.6 to follow corresponding low-frequency motions of the metrology structure of the metrology unit 110.1 capturing the spatial relationship between the first optical element unit 106.6 and the metrology structure of the metrology unit 110.1. By this approach excessive relative motion between the first optical element unit 106.6 and the metrology structure of the metrology unit 110.1 going beyond the capturing range of the capturing devices of the metrology unit 110.1 or, in other words, sensor range problems may be avoided in a very beneficial way.

It will be appreciated that the spatial relationship between the substrate table 104.2 and the substrate 104.1 is known, e.g. due to a measurement operation immediately preceding the exposure process. The same applies to the spatial relationship between the mask table 103.2 and the mask 103.1. Hence, the respective reference element 110.4 connected to the mask table 103.2 and the substrate table 104.2, respectively, also allows capturing the spatial relationship between the reference mirror 106.6 and the mask 103.1 and the substrate 104.1, respectively.

As a consequence, despite the fact that, typically, all components participating in the exposure process now have to be actively controlled, the requirements for the control bandwidth of the most critical first optical element unit 106.6 are greatly relaxed in a highly beneficial way. This positive effect, generally, largely outweighs the increased expense for the active support of all components.

Hence, for example, compared to conventional systems where, typically, an adjustment control bandwidth of 200 Hz to 300 Hz is used and considered necessary for each individual optical element unit, with the present invention a considerably lower adjustment control bandwidth, e.g. between 5 Hz to 100 Hz, preferably between 40 Hz to 100 Hz, may be used for the critical first optical element unit 106.6, while all other components participating in the imaging process (i.e. optical element units 106.1 to 106.5, mask unit 103.1 and substrate unit 104.1) may be readily controlled at the conventionally desired higher adjustment control bandwidth of, for example, 200 Hz to 400 Hz, to provide proper alignment with respect to the inertial reference formed by the first optical element unit 106.6.

It will be further appreciated that the above (indirect) measurement concept has the advantage that the instantaneous rigid-body position and orientation of the metrology structure of the metrology unit 110.1, in particular, vibrational disturbances introduced into the metrology structure of the metrology unit 110.1, are essentially irrelevant as long as the metrology structure is sufficiently rigid to largely avoid dynamic deformation of the metrology structure. In particular, less effort has to be made for stabilizing the position and/or orientation of the metrology structure in space. Typically, however, the metrology structure itself may nevertheless be supported by the projection optics box structure 102.1 in a vibration isolated manner.

It will be further appreciated that, with other embodiments of the invention, direct measurement of the spatial relation between the reference optical element (e.g. the sixth mirror) and any one of the respective further component (e.g. mirrors 106.1 to 106.5, mask 103.1 and substrate 104.1) participating in the imaging process may also be provided. Depending on the spatial boundary conditions an arbitrary combination of such direct and indirect measurements may also be used.

In the present embodiment, the second mirror 106.2 (being one of the second optical element units in the sense of the present invention) is a comparatively small and lightweight component, adjustment control of which may be readily performed at a high control bandwidth of about 250 Hz to 500 Hz. Hence, in the present embodiment the second mirror 106.2 can be used as a correction optical unit to correct imaging errors, in particular, line-of-sight errors, occurring in the exposure process. To this end, the control unit 109 generates, as a function of the metrology signals of the metrology unit 110.1 and/or eventually further signals (of the metrology unit 110.1 or other capturing devices) representative of the respective imaging error, corresponding control signals for the support device 108.2 of the second mirror 106.2 at a high correction adjustment frequency bandwidth of about 250 Hz to 500 Hz during transfer of the image onto the substrate 104.1 to provide adjustment of the second mirror 106.2 in the degrees of freedom required for appropriate correction.

It will be appreciated that, in addition or as an alternative, the mask unit 103 and/or the substrate unit 104 may be used as such a correction optical unit. Preferably, the optical element unit exhibiting a maximum resonant frequency among the optical element units of the optical system is used as the correction optical element unit. Furthermore, preferably, the optical element unit exhibiting a minimum optical footprint among the optical element units of the optical system is used as the correction optical element unit.

It will be further appreciated that, with other embodiments of the invention, instead of the reference element also the sensor head or reading head may be connected to the respective component participating in the imaging process while the reference element is connected to the metrology structure (in the case of an indirect measurement) or to the respective other component participating in the imaging process (in the case of direct measurement). Here as well, arbitrary combinations of the concepts for arranging the reading head and the reference element as outlined above are possible.

Figure 4:
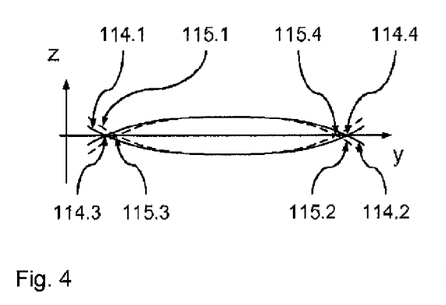
FIG. 4 is a diagram schematically representing a vibrational mode of the optical element unit of FIG. 2 seen in the sectional plane according to line IV-IV of FIG. 2.

In the following, a specific design of certain ones of the optical element units 106.1 to 106.6 will be described with reference to FIGS. 2 to 4 showing the design of the third mirror 106.3. It will be appreciated that this specific design of an optical element unit in itself embodies an invention which is independent of the support and control concept as outlined above.

As can be seen from FIGS. 2 and 3 the third mirror 106.3 has an elongated narrow mirror body 113.1 defining a plane of main extension of the mirror 106.3 as well as a circumferential direction and a radial direction both lying in the plane of main extension. The mirror 106.3 has a reflective optical surface 113.2 that is optically used in the imaging process and formed by a multi-layer coating of the mirror body 113.1. The optical surface 113.2 has an outer contour 113.3 extending in the circumferential direction of the mirror 106.3.

As can be seen from FIG. 2 the third mirror 106.3 has a generally rectangular or elliptic shape with longer outer contour sections 115.4 extending (in the plane of main extension) along a first direction (here: the y-direction) and shorter outer contour sections 115.5 extending (in the plane of main extension) along a second direction (here: the x-direction) which extends transverse to the first direction.

In the present embodiment, the longer outer contour sections 113.4, in the first direction, have a longer first dimension, while the shorter outer contour section 113.5, in the second direction, has a shorter second dimension, the longer first dimension being 175% of the shorter second dimension. It will be appreciated however that, with other embodiments of the invention, any other desired relation may be present between the first and second dimension. Preferably, the longer first dimension is at least 140% of the shorter second dimension.

The third mirror 106.3 is given its elongated narrow shape due to the spatial boundary conditions present in the projections optical box 102.1, in particular, due to the given, optical function related spatial arrangement of the optical elements 106.1 to 106.6 as well as the shape and arrangement of the light path of the exposure light. More precisely, the shape of the mirror 106.3 is due to the fact that the adjacent first mirror 106.1, the adjacent sixth mirror 106.6 and the space to be kept free for allowing the imaging light 105.1 to pass strongly limit the space available for the third mirror 106.3.

Herein, the adjacent first mirror 106.1 and the space to be kept free for the imaging light 105.1 limit the space available for the third mirror 106.3 in the second direction (here: the x-direction), while the adjacent sixth mirror 106.6 prevents accessibility of the rear side 113.6 of the third mirror 106.3.

As a consequence, a first region of the third mirror 106.3 along its longer outer contour sections 113.4 as well as on it is rear side 113.6 are not available for placement of the support units 111.1 to 111.3 as well as for the placement of the reference elements 110.4 of the three metrology units 110.2 capturing the position and orientation of the third mirror 106.3 in all six degrees of freedom.

Consequently, the interface areas for the support devices 111.1 to 111.3 are formed at protrusions in the form of lugs 113.7 to 113.9 radially protruding from the mirror body 113.1 at the short outer contour sections 113.5. The lugs 113.7 and 113.8 are formed at one end of the mirror body 113.1 while the remaining lug 113.9 is formed at the other end of the mirror body 113.1.

Each reference element 110.4 is mechanically directly connected to the outer contour of the mirror body 113.1 and is located in a recess 113.10 to 113.12 of the mirror body 113.1 formed between two consecutive ones (in the circumferential direction) of the lugs 113.7 to 113.9. The distance of the reference element location of the respective reference element 110.4 (in the plane of main extension) is thus reduced compared to a conventional design (as indicated by the dashed contour 115), to a reference element distance DR radially outward of the optical surface outer contour 113.3 which is about 3% of the maximum dimension or diameter $D_{max}$ of the optical surface 113.2.

It will be appreciated however that, with other embodiments of the invention, the reference element distance DR may range from 0% to 15% of the maximum dimension $D_{max}$ of the optical surface in the plane of main extension.

It should be noted that, typically, radially outside the functional optical surface (i.e. the surface optically used) there may be a so-called polishing allowance. The polishing allowance may be necessary for manufacture of the optical surface and to provide (mechanical) sealing to the mini-environment to seal the optical surface from outgassing.

This design with the recesses 113.10 to 113.12 of the mirror body 113.1 has the advantage that the geometry, the mass distribution and the rigidity distribution of the third mirror 106.3 is such that the reference element location of each reference element to 110.4 is located at (or at least closer to) a nodal point of the first vibration mode of the third mirror 106.3 as will be explained in the following with reference to FIG. 4.

Since the third mirror 106.3 is a generally elongated narrow and slim element, it has a first a deformation vibration mode at a given resonant frequency which is a bending vibration about a bending axis lying in its plane of main extension and extending the second direction (x-direction). FIG. 4, in a very general way (in a sectional plane along line IV-IV of FIG. 2), shows a first maximum deflection situation 114.1 and a second maximum deflection situation 114.2 of a central layer 113.13 of the mirror body 113.1 at this first vibrational mode. As can be seen from FIG. 4, there are two nodal points 114.3 and 114.4 where the central layer 113.13 and, hence, the mirror 106.6 exhibits minimum bending excursion in the direction (z-direction) perpendicular to its plane of main extension.

As it is also shown in FIG. 4, a conventional mirror design as it is indicated in FIG. 2 by the dashed contour 115 would exhibit a first vibrational mode having a first maximum deflection situation 115.1 and a second maximum deflection situation 115.2. Here two nodal points 115.3 and 115.4 would be formed which are located further radially inwards from the nodal points 114.3 and 114.4.

As a consequence, with a conventional design as indicated by contour 115 the nodal points of this first vibrational mode are located at a considerable distance from the outer circumference of the mirror 115. Hence, the reference element would be arranged in a location that, in this first vibrational mode, moves in anti-phase to the central part of the mirror 115 with the optical surface which ultimately has to be adjusted according to given specifications. Such an out-of-phase measurement typically leads to instability of the control loop.

As outlined above, with the present invention, the geometry, mass distribution and rigidity distribution of the third mirror 106.3 achieved via the recesses of 113.10 to 113.12 result in a radially outward shift of the respective nodal point 114.3, 114.4 towards the second section of the mirror 106.3 which is available for placement of the reference elements 110.4 which greatly alleviates these problems. Furthermore, the recesses 113.10 to 113.12 allow shifting the reference location of the reference elements 110.4 along with the sensor head 110.3 connected to the metrology structure (not shown in FIG. 2) radially inwards, such that ultimately, a coincidence of the reference element location and the nodal points 114.3 and 114.4, respectively, may be achieved.

Shifting the location of the nodal points 114.3 and 114.4 towards the reference element location has the great advantage that vibration induced deformation of the optical element unit does not or at least less adversely influence the result of capturing processes performed by the metrology arrangement, which are ultimately intended to obtain the so-called rigid body motions of the mirror 106.3. Such an elimination of vibration deformation influences on the capturing result greatly improves speed and stability of the adjustment process.

As mentioned above, in the present example, the nodal points 114.3 and 114.4 substantially coincide with the reference element locations. It will be appreciated however that, with other embodiments of the invention, a certain nodal point distance between the nodal points and the reference element location may exist. Preferably, this nodal point distance ranges from 0% to 10% of the maximum diameter $D_{max}$ of the optical surface 113.2 in the plane of main extension.

In the present example with its generally vertical arrangement of the optical column it is particularly beneficial that, due to the encoder principle used in the metrology devices 110.2, the minimized excursion in the z-direction at the reference elements 110.4 leads to a highly precise measurement result in the optically highly sensitive optically sensitive degrees of freedom, namely the translatory degree of freedom along the z-axis and the two rotatory degrees of freedom about the x-axis and the y-axis.

It will be appreciated that, with other embodiments of the invention, in addition or as an alternative, the modification of the structural rigidity distribution and, hence, shift of the nodal points may be achieved, for example, by introducing compliance providing features such as one or more recesses (such as appropriate grooves, bores or the like) or cavities into the optical element unit, e.g. in the region of the outer circumference of the optical element unit as it is indicated in FIG. 3 by the double-dot-dashed contours 113.14. These compliance providing features 113.14 provide, to a certain extent, dynamic decoupling of the part of the mass located radially outward of these compliance providing features 113.14 thereby achieving the desired outward shift of the nodal points.

It will be further appreciated that there may be more than one optical elements experiencing the same spatial boundary condition restrictions regarding the placement of the reference location of the reference elements and requiring the indicated shift of the nodal points. In the present example, this may be the first mirror 106.1.

With the optical imaging apparatus 101 of FIG. 1 a preferred embodiment of a method of transferring an image of a pattern onto a substrate according to the invention may be executed using a preferred embodiment of a method of supporting components of an optical projection unit according to the invention as well as a preferred embodiment of method of capturing a spatial relationship between an optical element unit and a reference unit according to the invention as it will be described in the following with reference to FIGS. 1 to 4.

In a transferring step 116 of this method, an image of the pattern formed on the mask 103.1 is transferred onto the substrate 104.1 using the optical projection unit 102 of the optical imaging arrangement 101.

To this end, in a capturing step 116.1 of the transferring step 116, the spatial relationship between the components 106.1 to 106.6, 103.1 and 104.1 participating in the imaging process is captured using a preferred embodiment of the method of capturing a spatial relationship between an optical element unit and a reference unit according to the invention as it has been outlined above.

In a controlling step 116.2 of the transferring step 116, the position and/or orientation of the substrate table 104.2, the mask table 103.2 and the other mirrors 106.1 to 106.5 with respect to the sixth mirror 106.6 as well as the position and/or orientation of the sixth mirror 106.6 with respect to the metrology structure of the metrology unit 110.1 is controlled as a function of the spatial relationship previously captured in the capturing step 116.1 as it has been outlined above. In an exposure step 116.3, immediately following or eventually overlapping the controlling step 116.2, the image of the pattern formed on the mask 103.1 is then exposed onto the substrate 104.1 using the optical imaging arrangement 1.

In a step 116.4 of the capturing step 116.1, the mask unit 103 with the mask 103.1 and the substrate unit 104 with the substrate 104.1 previously provided are adjusted in space. It will be appreciated that the mask 103.1 and the substrate 104.1 may also be inserted into the mask unit 103 and the substrate unit 104, respectively, at a later point in time prior to the actual position capturing or at an even later point in time prior to the exposure step 116.3.

In a step 116.5 of the capturing step 116.1, the components of the optical projection unit 102 are provided and supported according to a preferred embodiment of a method of supporting components of an optical projection unit according to the invention as it has been outlined above. To this end, in a step 116.6, the mirrors 106.1 to 106.6 of the optical projection unit 102 are provided and positioned within the projection optics box 102.1 of the optical projection unit 102. In a step 116.7, the mirrors 106.1 to 106.6 actively supported at the respective control bandwidth in the projection optics box 102.1 to provide a configuration as it has been described above in the context of FIGS. 1 to 3.

In a step 116.8 of the capturing step 116.1 the metrology arrangement 110 previously provided to provide a configuration as it has been described above in the context of FIGS. 1 to 3 is used. It will be appreciated that the reference elements 110.2 may already have been provided at an earlier point in time together with the respective mirror 106.1 to 106.6 on which they are located. However, with other embodiments of the invention, the reference elements 110.4 may be provided together with the other components of the metrology arrangement 110 at a later point in time prior to the actual position capturing.

In a step 116.9 of the capturing step 116.1, the actual spatial relationship between the sixth mirror 106.6 as a central inertial reference of the optical imaging arrangement 101 and the substrate table 104.2, the mask table 103.2 as well as the other mirrors 106.1 to 106.5 is then captured as it has been outlined above.

It will be appreciated that the actual spatial relationship between the sixth mirror 106.6 and the substrate table 104.2, the mask table 103.2 and the other mirrors 106.1 to 106.5 as well as the actual spatial relationship of the sixth mirror 106.6 with respect to the metrology structure of the metrology unit 110.1 may be captured continuously throughout the entire exposure process. In the step 116.9, the most recent result of this continuous capturing process is then retrieved and used.

As described above, in the controlling step 116.2, the position of the substrate table 104.2, the mask table 103.2 and the mirrors 106.1 to 106.6 is then controlled as a function of this spatial relationship previously captured before, in the exposure step 116.3, the image of the pattern formed on the mask 103.1 is exposed onto the substrate 104.1.

Second Embodiment

In the following, a second preferred embodiment of an optical imaging arrangement 201 according to the invention with which preferred embodiments of the methods according to the invention may be executed will be described with reference to FIG. 5. The optical imaging arrangement 201 in its basic design and functionality largely corresponds to the optical imaging arrangement 101 such that it is here mainly referred to the differences. In particular, like components are given the same reference numeral increased by the value 100. Unless explicitly deviating statements are given in the following, explicit reference is made to be explanations given above in the context of the first embodiment with respect to these components.

The only difference between the optical imaging arrangement 201 and the optical imaging arrangement 101 lies within the deviating design of the third mirror 206.3. It will be appreciated the third mirror 206.3 may replace the third mirror 106.3 in the optical imaging arrangement 101.

Figure 5:
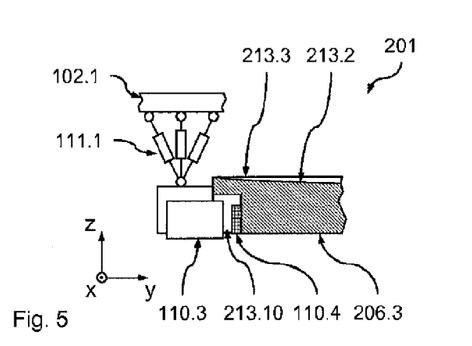
FIG. 5 is a block diagram of a preferred embodiment of a method of transferring an image of a pattern onto a substrate according to the invention which may be executed with the optical imaging arrangement of FIG. 1.

As can be seen from FIG. 5 showing a sectional representation of a part of the third mirror 206.3 (in a sectional plane similar to the one according to line IV-IV of FIG. 2), the only differences of the third mirror 206.3 with respect to the third mirror 106.3 lies in the fact that the mirror 206.3 has a longer dimension in the first direction (y-direction) than the mirror 106.3 (as is indicated in FIG. 2 by the dashed lines 217) and in that the radial recess 213.10 reaches underneath the optical surface 213.2 of the third mirror 206.3 such that a reference element 110.4 may also be located underneath the optical surface 213.2.

Here again the recess 213.10 provides a modification of the geometry, the mass distribution and the rigidity distribution of the mirror 206.3 which may bring the nodal points of the first vibrational mode and the reference element location close enough together to achieve the advantages as outlined above. It will be appreciated that this approach will be taken for the other reference element locations at the other end of the mirror 206.3.

Although, in the foregoing, embodiments of the invention have been described where the optical elements are exclusively reflective elements, it will be appreciated that, with other embodiments of the invention, reflective, refractive or diffractive elements or any combinations thereof may be used for the optical elements of the optical element units.

What is claimed is:

1. An arrangement, comprising:
   an optical projection unit comprising:
      a support structure; and
      a group of optical element units configured to transfer an image of a pattern of a first object onto a second object; and
   a control device,
   wherein:
      the group of optical element units comprises a first optical element unit and a plurality of second optical element units;
      the first and second optical element units are actively supported by the support structure under control by the control device;
      the first optical element unit is actively supported at a first control bandwidth;
      the second optical element units are actively supported at a second control bandwidth to substantially maintain a given spatial relationship of each of the second optical elements with respect to the first optical element unit;
      the first control bandwidth is lower than the second control bandwidth; and
      the arrangement is an optical imaging arrangement.

2. The arrangement of claim 1, wherein at least one of the following holds:
   the first control bandwidth ranges from 5 Hz to 100 Hz;
   the second control bandwidth ranges from 20 Hz to 400 Hz; and
   the second control bandwidth is different for at least two of the second optical element units.

3. The arrangement of claim 1, wherein:
   the first optical element unit is supported by the support structure via an active first support unit;
   each of the second optical element units is supported by the support structure via an active second support unit;
   the first support unit is configured to adjust at least one of an orientation and a position of a first optical element of the first optical element unit in at least one degree of freedom at a first adjustment frequency bandwidth ranging from 5 Hz to 100 Hz; and
   each of the second support units is configured to adjust at least one of an orientation and a position of a second optical element of an associated second optical element unit in at least one degree of freedom at a second adjustment frequency bandwidth which is at least equal to the first adjustment frequency bandwidth and ranges from 5 Hz to 400 Hz.

4. The arrangement of claim 3, wherein at least one of the following holds:
   the orientation and the position of the first optical element are adjusted in all six degrees of freedom;
   the first adjustment frequency bandwidth ranges from 40 Hz to 100 Hz;
   the orientation and the position of at least one of the second optical elements are adjusted in all six degrees of freedom; and
   the second adjustment frequency bandwidth ranges from 100 Hz to 300 Hz.

5. The arrangement of claim 3, wherein:
   at least one of the active support devices comprises at least one of an actuator device and a gravity compensation device;
   the actuator device is adapted to actively adjust at least one of an orientation and a position of an optical element of the optical element unit; and
   the gravity compensation device is adapted to at least partially compensate a gravitational force acting on the optical element unit.

6. The arrangement of claim 5, wherein:
   a member of the optical imaging arrangement comprises at least one member selected from the group consisting of a non-contact actuator, an active magnetic actuator, a Lorentz actuator and a passive gravity compensator; and
   the member the actuator device and/or the gravity compensation device.

7. The arrangement of claim 1, wherein at least one of the following holds:
   each of the optical element units of the group of optical element units exhibits a resonant frequency, the first optical element unit exhibiting a minimum resonant frequency among the optical element units of the group of optical element units;
   each of the optical element units of the group of optical element units exhibits an optical footprint, the first optical element unit exhibiting a maximum optical footprint among the optical element units of the group of optical element units; and
   the first optical element unit is a last optical element unit of the optical projection unit before the first object along a path of light through the optical imaging unit during use of the optical imaging arrangement.

8. The arrangement of claim 1, further comprising a metrology arrangement configured to capture a spatial relationship between the first optical element unit defining a reference optical element unit and at least one further component of the optical imaging arrangement, wherein the metrology arrangement comprises a reference element mechanically connected directly to one of the reference optical element unit and the further component.

9. The arrangement of claim 8, wherein the reference element comprises a reference surface comprising at least one member selected from the group consisting of a reflective surface and a diffractive surface.

10. The arrangement of claim 8, wherein at least one of the following holds:
   the metrology arrangement is configured to capture a spatial relationship between the reference optical element unit and at least one of a further optical element unit of the group of optical element units, a first unit receiving the first object and a second unit receiving the second object substrate; and
   the first optical element unit is actively supported at the first control bandwidth to substantially maintain a given spatial relationship of the first optical element unit with respect to a metrology structure of the metrology arrangement.

11. The arrangement of claim 8, wherein:
   the metrology arrangement comprises a metrology structure;
   the metrology arrangement is configured to capture a first spatial relationship between the metrology structure and the reference optical element unit and a second spatial relationship between the metrology structure and the further component; and
   the metrology arrangement is configured to determine the spatial relationship between the reference optical element unit and the further component based on the first spatial relationship and the second spatial relationship.

12. The arrangement of claim 1, wherein the optical projection unit uses exposure light in an EUV range at a wavelength between 5 nm to 20 nm.

13. The arrangement of claim 1, further comprising a metrology arrangement configured to capture a spatial relationship between an optical element unit of the group of optical element units and a reference unit of the optical imaging arrangement, wherein the control device is connected to the metrology arrangement to receive a signal representative of the spatial relationship between the optical element unit and the reference unit, and the control device is configured to control at least one of a position and an orientation of a component of the optical imaging arrangement during the transfer of the image of the pattern onto the substrate as a function of the signal received from the metrology arrangement.

14. The arrangement of claim 13, wherein:
   the control device is configured to control, in at least one degree of freedom, at least one of a position and an orientation of an optical component of a correction optical unit at a correction adjustment frequency bandwidth during use of the optical imaging arrangement as a function of the signal received from the metrology arrangement to correct an imaging error of the exposure process, the correction optical unit being one of the second optical element units, the mask unit and the substrate unit; and
   at least one of the following holds:
      the correction adjustment frequency bandwidth ranges from 200 Hz to 500 Hz;
      each of the optical element units of the group of optical element units has a resonant frequency, the correction optical element unit having a maximum resonant frequency among the optical element units of the group of optical element units;
      each of the optical element units of the group of optical element units has an optical footprint, the correction optical element unit having a minimum optical footprint among the optical element units of the group of optical element units; and
      the first optical element unit, along a path of light through the optical imaging arrangement, is a second optical element unit of the optical projection unit which the light impinges during use of the optical imaging arrangement.

15. The arrangement of claim 1, wherein the group of optical element unit consists of four to eight optical element units.

16. The arrangement of claim 1, wherein at least one of the following holds:
   the first object is supported by a first unit which is actively supported and adjusted by a support structure at a third control bandwidth and the second object is supported by a second unit which is actively supported and adjusted by a support structure at a fourth control bandwidth;
   each of the first unit and the second unit is actively adjusted to substantially maintain a given spatial relationship with respect to the first optical element unit; and
   each of the third control bandwidth and the fourth control bandwidth is at least equal to the first control bandwidth and ranges from 20 Hz to 500 Hz.

17. An arrangement comprising:
   an optical projection unit comprising a support structure and a group of optical element units configured to transfer an image of a pattern of a first object onto a second object; and
   a metrology arrangement;
   wherein:
      the group of optical element units comprises a plurality of optical element units;
      the metrology arrangement is configured to capture, in at least one degree of freedom, a spatial relationship between a reference unit and an associated optical element unit of the group of optical element units;
      the metrology arrangement comprises a reference element;
      the reference element is mechanically connected directly to the associated optical element unit at a reference element location;
      selection of the reference element location is limited by spatial boundary conditions of the associated optical element unit;
      the associated optical element unit has a deformation vibration mode at a resonant frequency;
      the optical element unit, in the deformation vibration mode, exhibits deformation induced motion in the at least one degree of freedom and has at least one nodal point with minimum motion in the least one degree of freedom;
      at least one of a geometry, a mass distribution and a rigidity distribution of the optical element unit is selected as a function of the reference element location so that the reference element location is located at least close to the nodal point; and
      the arrangement is an optical imaging arrangement.

18. The optical imaging arrangement according to claim 17, wherein:
   the reference element location, in a plane of main extension of the optical element unit, is located at a nodal point distance from the nodal point; and the nodal point distance ranges from 0% to 10% of a maximum dimension of the optical surface in said plane of the extension.

19. The optical imaging arrangement according to claim 17, wherein:
   at least one of the optical element unit, said exposure light path and an adjacent component defines a first region of the optical element unit wherein the spatial boundary conditions exclude placement of said reference element;
   at least one of the optical element unit and the adjacent component defines a second region of the optical element unit wherein the reference element is located; and
   at least one of a geometry, a mass distribution and a rigidity distribution of the optical element unit is selected as a function of the reference element location so that the second region comprises the nodal point.

20. An arrangement, comprising:
   an optical projection unit comprising a support structure and a group of optical element units configured to transfer an image of a pattern of a first object onto a second object,
   wherein:
      the group of optical element units comprises a first optical element unit and a plurality of second optical element units;
      the first optical element unit, the second optical element units, the first object and the second object are actively supported by the support structure under a control by the control device;
      the first optical element unit is actively supported at a first control bandwidth;
      the second optical element units are actively supported at a second control bandwidth to substantially maintain a given spatial relationship of each of the second optical elements with respect to the first optical element unit;
      the first control bandwidth is lower than the second control bandwidth;
      the mask unit is actively supported at a third control bandwidth to substantially maintain a given spatial relationship of the mask unit with respect to the first optical element unit;
      the substrate unit is actively supported at a third control bandwidth to substantially maintain a given spatial relationship of the substrate unit with respect to the first optical element unit; and
      the arrangement is an optical imaging arrangement.

21. The arrangement of claim 1, wherein the second control bandwidth is different for at least two of the second optical element units.

22. The arrangement of claim 20, wherein the second control bandwidth is different for at least two of the second optical element units.

* * * * *